United States Patent [19]
Wen

[11] Patent Number: 5,851,885
[45] Date of Patent: Dec. 22, 1998

[54] MANUFACTURING METHOD FOR ROM COMPONENTS HAVING A SILICON CONTROLLED RECTIFIER STRUCTURE

[75] Inventor: Jemmy Wen, Hsinchu City, Taiwan

[73] Assignee: United Microelectronics Corp., Hsinchu City, Taiwan

[21] Appl. No.: 866,320

[22] Filed: May 30, 1997

[30] Foreign Application Priority Data

Mar. 26, 1997 [TW] Taiwan ................................. 86103880

[51] Int. Cl.⁶ .................... H01L 21/8234; H01L 21/8246
[52] U.S. Cl. ............................................. 438/275; 438/279
[58] Field of Search ................................... 438/275, 276, 438/277, 278, 279; 257/390, 391

[56] References Cited

U.S. PATENT DOCUMENTS 5,426,066  6/1995  Fu et al. ................................... 438/275
5,514,605  5/1996  Asai et al. ............................... 438/275
5,747,856  5/1998  Chen et al. .............................. 438/275

*Primary Examiner*—Joni Chang
*Attorney, Agent, or Firm*—Finnegan, Henderson, Farabow, Garrett & Dunner, L.L.P.

[57] ABSTRACT

A manufacturing method and a structure for ROM component having a silicon controlled rectifier as the basic memory instead of a channel transistor in a conventional ROM, and using a formation of contact windows for coding a ROM instead of performing an ion implantation process. Also, since a silicon controlled rectifier occupies a smaller component surface area, the level of integration is correspondingly increased, and furthermore, because of the interposition of an insulating layer between two bit lines, short circuiting between the adjacent bit lines are prevented. The component of this invention operates by applying a suitable voltage to the word line electrode and the bit line electrode respectively to select a particular memory unit, and as a result, a current will flow in a vertical direction through the memory unit, exit through the common electrode depending on the ON/OFF state of the memory, and be detected there.

31 Claims, 8 Drawing Sheets

MANUFACTURING METHOD FOR ROM COMPONENTS HAVING A SILICON CONTROLLED RECTIFIER STRUCTURE

BACKGROUND OF THE INVENTION

1. Field of Invention

This invention relates to read-only-memory (ROM) components and to methods for manufacturing same, and, more particularly, to such ROM components and manufacturing methods in which a silicon controlled rectifier structure is included and formed having a memory coded through the formation of contact windows so that each basic memory unit is a silicon controlled rectifier.

2. Description of Related Art

ROMs are now widely used in digital equipment such as microcomputers and microprocessor operating systems. Resident programs used by operating systems such as BIOS are normally kept in ROMs. Due to the complicated manufacturing processes for ROMs, involving many time consuming steps and material processings, generally, customers will submit their program codes to a ROM manufacturer, and have the manufacturer code the programs into their ROM products.

Most of the ROM components, aside from a difference in the code being stored in the programming phase, basically have the same physical structure. Therefore, the ROMs can be manufactured up to the step immediately before actual programming, and the partially finished products can be inventoried in a warehouse, for example. When the customer makes an order for a certain program code to be installed in the ROM, a set of photomasks can be promptly manufactured and subsequent programming carried out with short notice. The practice of photomask programming on prefabricated ROM is now becoming the norm in the semiconductor manufacturing industry.

In general, a channel transistor is employed as the basic memory cell unit of a ROM, and during the programming phase, ions are selectively implanted into specified channels so as to adjust the threshold voltage to achieve the ON/OFF state of the channel transistor. For a better understanding of the manufacturing processes and operations presently used to create a ROM, FIGS. 1A through 1C show the structure of a conventional ROM. FIG. 1A shows part of the top, FIG. 1B shows part of the front, while FIG. 1C shows part of a cross-sectional elevation of the ROM. A conventional ROM structure includes a substrate 10, for example, a P-type silicon substrate, having a plurality of bit lines (BL) 11, an oxide layer 12 and a plurality of word lines (WL) 13 formed on top. In the ROM structure shown in FIG. 1A, areas 14 enclosed by the rectangular dashed lines form the memory units. Whether a binary bit of "0" or "1" is burnt in a binary level memory unit is determined solely by whether or not ions are implanted into the channel 16 of the memory unit.

FIG. 1C shows a manufacturing method for a conventional ROM. First, N-type impurities such as arsenic ions are implanted into a substrate 10 forming a plurality of equidistantly distributed bit lines 11, and the area between two bit lines 11 constitute a channel region 16. Next, an oxidation process is carried out to form an oxide layer 12 on the surface of the bit lines 11 and the channel regions 16. Then, a conductive layer, for example, a heavily doped polysilicon layer, is formed, followed by photolithographic and etching processes to form word lines 13 that cross over the bit lines 11, thus establishing the channel transistors and finishing the necessary steps for the first half of the fabrication of a conventional ROM. Subsequently, programs are coded by first forming a masking layer 15 that exposes the desired coding channel regions 16, and then implanting P-type impurities, for example, boron ions, to complete the coding implantation. Different doping sources can be used to acquire the necessary properties for the transistors while the ROM is undergoing a programming operation.

The conventional ROM described above uses a channel transistor as the basic ROM unit. The manufacturing steps required for the formation of the channel transistors are rather complicated, and the coding implant must be performed before the completion of the channel transistors. Hence manufacturing options are quite limited.

Another limitation in the conventional ROM is due to the rather large surface area occupied by each MOS transistor, so that when the MOS transistors are scaled down, punch through phenomenon can easily occur. As a result, increase in the level of component integration is somewhat restricted.

SUMMARY OF THE INVENTION

It is therefore an object of this invention to provide ROM components and a manufacturing method for such components having a silicon controlled rectifier structure with the ON/OFF state of each memory unit determined by the definition of a contact window. Through this arrangement, the desired coding is achieved, and furthermore, the coding process can be put off until a later stage.

A second object of this invention is to provide ROM components and a manufacturing method for such components having a silicon controlled rectifier structure as a replacement for the conventional channel transistor as a basic memory unit, so that the area occupation of each device is reduced.

A third object of this invention is to provide ROM components and a manufacturing method for such components having a silicon controlled rectifier structure which operates by applying a suitable voltage to the respective word line electrode and the bit line electrode to select a particular memory unit, with the resulting current flowing inside a memory unit in a vertical direction to be finally detected in the common electrode.

Other objects, advantages and the purpose of the invention will be set forth in part in the description which follows, and in part will be obvious from the description, or may be learned by practice of the invention. The objects, advantages and purpose of the invention will be realized and attained by means of the elements and combinations particularly pointed out in the appended claims.

To attain the objects and advantages, and in accordance with the purpose of the invention, as embodied and broadly described herein, the invention comprises a method for manufacturing a ROM component having a silicon controlled rectifier structure, comprising the steps of:

(a) providing a substrate having a planar surface and forming a first insulating layer over the planar surface;

(b) forming in sequence, a heavily doped first type impurity layer, a lightly doped second type impurity layer and a lightly doped first type impurity layer over the surface of the first insulating layer;

(c) processing the lightly doped first type impurity layer, the lightly doped second type impurity layer and the heavily doped first type impurity layer to form a plurality of generally parallel and separate strips of bit lines lying in a first direction;

(d) forming a second insulating layer on the first insulating layer and on the bit lines;

(e) removing part of the second insulating layer so that a remainder of the second insulating layer is at the same level as the lightly doped first type impurity layer;

(f) processing the lightly doped first type impurity layer and the lightly doped second type impurity layer of the bit lines to form a plurality of first contact windows in the bit lines;

(g) forming a plurality of spacers on sidewalls of the contact windows;

(h) applying a first photoresist layer having a pattern to expose the first contact windows and part of the lightly doped first type impurity layer;

(i) doping first type ions into the heavily doped first type impurity layer at the bottom of the contact windows and the exposed portion of the lightly doped first type impurity layer, using the first photoresist layer and the spacers as masks, to form a plurality of first type diffusion regions and thereafter removing the first photoresist layer;

(j) filling a first conducting layer into the first contact windows so that the top surface of the first conducting layer is at the same level as the lightly doped first type impurity layer;

(k) applying a second photoresist layer on the second photoresist layer, the second photoresist layer having a pattern to expose part of the lightly doped first type impurity layer;

(l) doping second type ions into the exposed portion of the lightly doped first is type impurity layer, using the second photoresist layer as a mask, to form a plurality of second type diffusion regions, and thereafter removing the second photoresist layer to expose an intermediate top surface;

(m) forming a third insulating layer over the intermediate top surface;

(n) forming a plurality of second contact windows in the third insulating layer to expose the first conducting layer, the first type diffusion regions and part of the second type diffusion regions;

(o) forming a second conducting layer on the surface of the third insulating layer such that the second conducting layer fills the second contact windows; and (p) forming in the second conducting layer a plurality of triggering word line electrodes above the first type diffusion regions, a plurality of common electrodes above the first conducting layer, and a plurality of generally parallel and separate strips of bit line electrodes lying in a second direction, so that the first and second directions cross each other at an angle.

In another aspect, the invention is directed to a ROM product having a silicon controlled rectifier structure, comprising a substrate having a planar surface and a first insulating layer on the planar surface; a plurality of bit lines on the surface of the first insulating layer and extending in a first direction, the bit lines including in sequence upward from the first insulating layer surface, a heavily doped first type impurity layer, a lightly doped second type impurity layer, and a lightly doped first type impurity layer; a second insulating layer above the first insulating layer between the bit lines and having a height equal to that of the bit lines; a plurality of first contact windows in each of the bit lines and having bottoms at the heavily doped first type impurity layer; a plurality of spacers on sidewalls of the first contact windows; a plurality of first type diffusion regions in the heavily doped first type impurity layer at the bottoms of the first contact windows, and in the lightly doped first type impurity layer; a first conducting layer filling the first contact windows; a plurality of second type diffusion regions in the lightly doped first type impurity layer; a third insulating layer over the lightly doped first type impurity layer, the second insulating layer, and the first conducting layer; a plurality of second contact windows in the third insulating layer and opening to the first conducting layer, the first type diffusion regions and selected ones of the second type diffusion regions; a plurality of triggering word line electrodes located in the second contact windows above the second type diffusion regions and covering part of the third insulating layer; a plurality of common electrodes inside the second contact windows above the first conducting layer and covering part of the third insulating layer; and a plurality of bit line electrodes located above the surface of the third insulating layer, and filling the second contact windows, the bit line electrodes being generally parallel to and separate from each other and extending in a second direction, the first direction and the second direction crossing each other at an angle, the word lines and the bit line electrodes crossing each other to form a plurality of memory units, wherein the selected ones of the second diffusion regions, having a second contact window, form ON state memory units and others of the second diffusion regions, without a second contact window, form OFF state memory units.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate one exemplary embodiments of the invention and together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 1A:
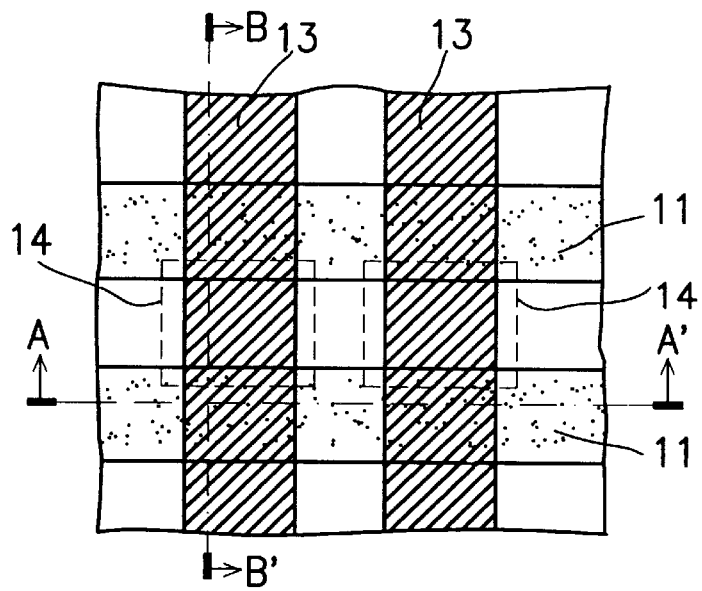
FIG. 1A is a fragmentary top view showing the structure of a conventional ROM.
Figure 1B:
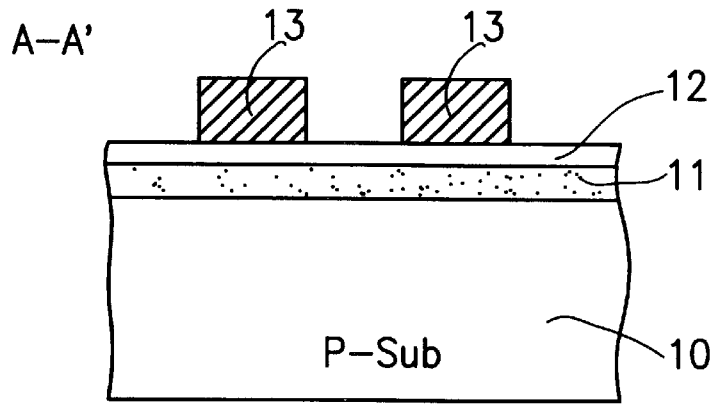
FIG. 1B is a cross-section showing the structure of a conventional ROM.
Figure 1C:
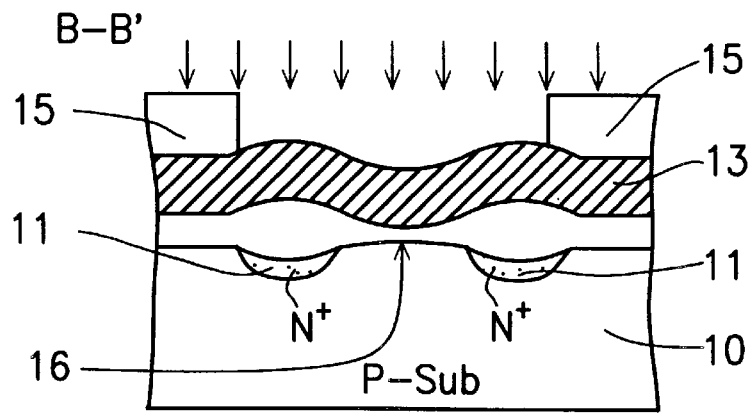
FIG. 1C is a cross-section showing the structure of a conventional ROM.
Figure 2A:
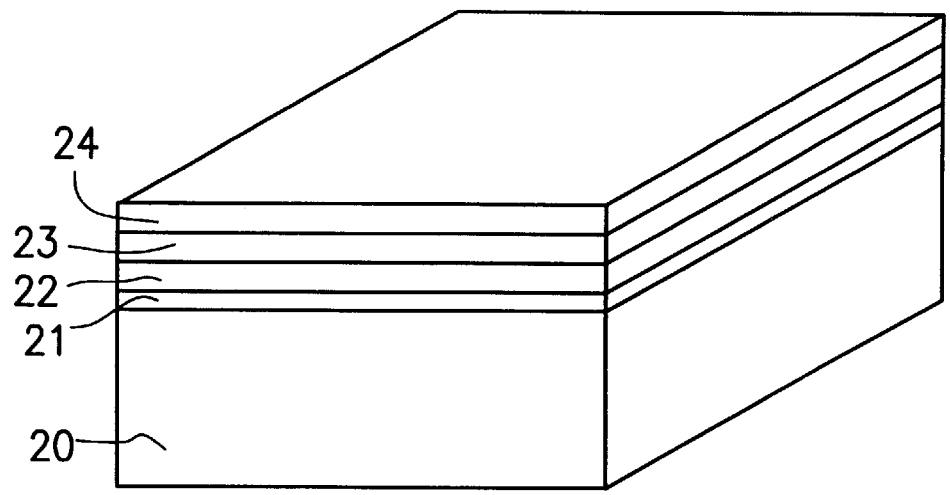
FIGS. 2A through 2J are a series of perspective and cross-sectional views showing the progression of manufacturing steps for making a ROM component having a silicon controlled rectifier structure according to a preferred embodiment of this invention.
Figure 2B:
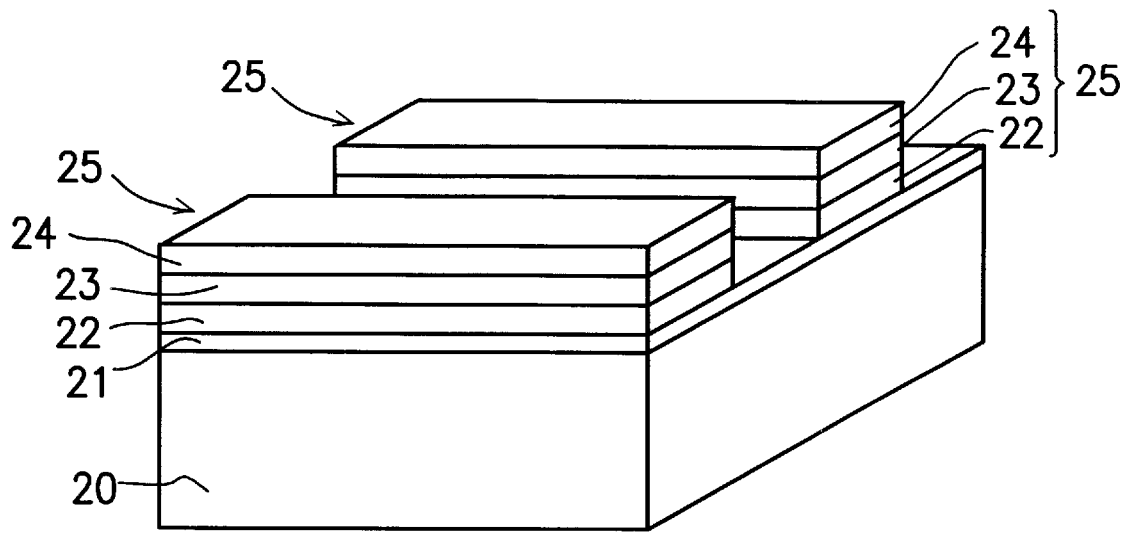

FIGS. 2A through 2J are a series of perspective and cross-sectional views showing the manufacturing steps for forming a ROM component having a silicon controlled rectifier structure according to one preferred embodiment of this invention. First, as shown in FIGS. 2A and 2B, a planar surface is provided on the top of a substrate 20, such as a P-type or an N-type silicon substrate, or an electrically insulating body. An insulating layer 21, for example, a silicon dioxide or a silicon nitride layer, is formed on the planar surface of the substrate 20. Epitaxial growth processes are then used to form, in sequence, a heavily doped first type impurity layer 22 with a concentration level of about $10^{20}/cm^3$, a lightly doped second type impurity layer 23 with a concentration level of about $10^{17}/cm^3$ and a lightly doped first type impurity layer 24 with a concentration level of about $10^{16}/cm^3$ over the insulating layer 21 surface. The first type impurity is an N-type and the second type impurity is a P-type or the first type impurity is a P-type and the second type impurity is an N-type. Subsequently, using photolithographic and etching processes, the lightly doped first type impurity layer 24, the lightly doped second type impurity layer 23 and the heavily doped first type impurity layer 22 are shaped to form a plurality of generally parallel and separate strips of bit lines 25 as shown in FIG. 2B.

Figure 2C:
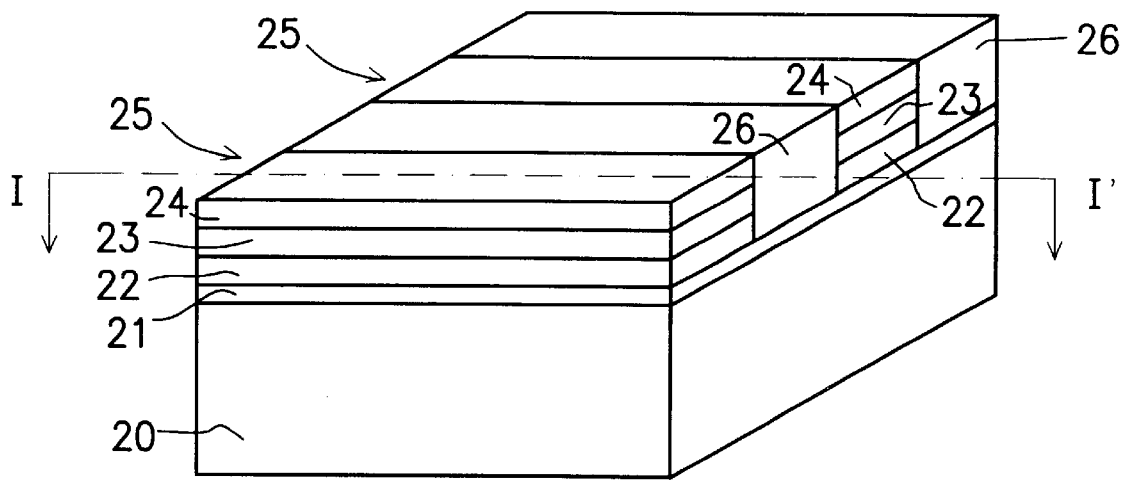
Figure 2D:
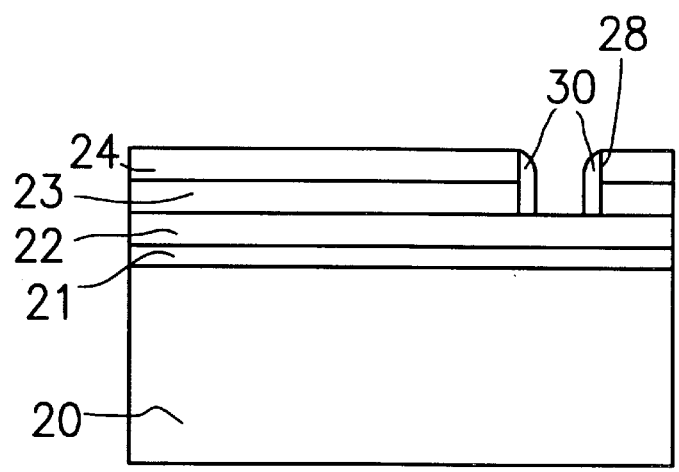

In FIG. 2C, each of the bit lines 25 is isolated by forming an insulating layer 26, for example, a silicon dioxide layer, over the insulating layer 21 and the bit lines 25 surfaces. Then, part of the insulating layer 26 is removed so that the height of the remainder of the insulating layer 26 is at the same level as the lightly doped first type impurity layer 24, for example, using an anisotropic etching back process or a chemical-mechanical polishing method.

FIGS. 2D through 2J are a series of largely schematic cross-sectional diagrams depicting successive subsequent forming steps as seen in a cutting plane III—III of FIG. 2C. First, in FIG. 2D, photolithographic and etching processes are used to form contact windows 28 in the lightly doped impurity layers 24 and 23 to expose the heavily doped first type impurity layer 22 below. Then, spacers 30 are formed on the sidewalls of the contact window 28. The spacers 30 are formed, for example, by first forming a silicon dioxide layer or a silicon nitride layer over the bit lines 25, insulating layer 26 and the contact window 28, and then using anisotropic etching to remove part of the silicon dioxide or silicon nitride layer.

Figure 2E:
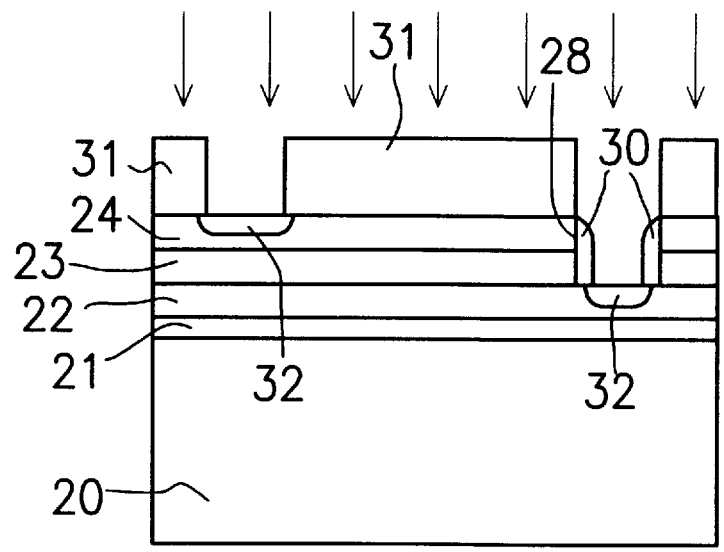

In FIG. 2E, a photoresist layer 31 is applied by coating the lightly doped impurity layer 24, followed by a photolithographic process to define a pattern in the photoresist layer 31 to expose the contact window 28 and part of the impurity layer 24. Using the patterned photoresist layer 31 and the spacers 30 as masks, first type ions are doped into the heavily doped first type impurity layer 22 at the bottom of the contact window 28 and at the exposed lightly doped first type impurity layer 24 forming first type diffusion regions 32. The first type ions are N-type ions or P-type ions. The implantation depth of the first type diffusion regions 32 located within the lightly doped first type impurity layer 24 is such that no contact is made by the first type diffusion regions 32 with the lightly doped second type impurity layer 23 below.

Figure 2F:
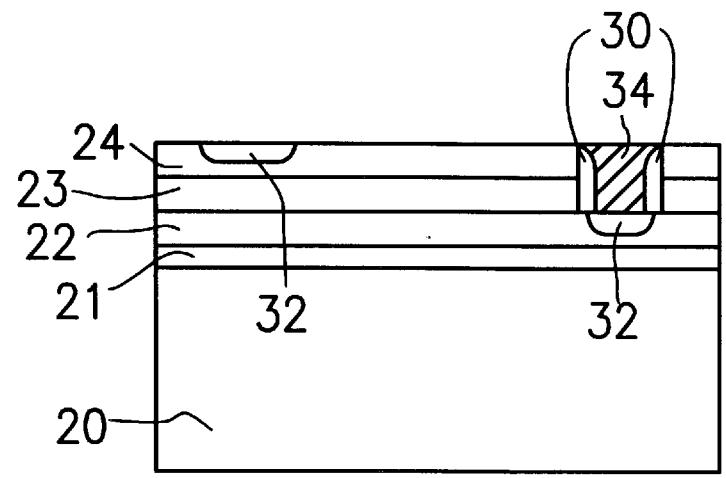

Referring next to FIG. 2F, the photoresist layer 31 is removed. Thereafter, a conducting layer 34 is formed to fill the contact window 28. The conducting layer 34, for example, can be formed by first forming a heavily doped polysilicon layer or a metallic tungsten layer over the surfaces of various aforementioned layers, followed by an anisotropic etching back process or a chemical-mechanical polishing method to remove the unwanted layer portions of conducting material using the lightly doped first type impurity layer as an etching end point. As a result, an intermediate top surface is provided over the layer 24, the first type diffusion layer 24, and the conducting layer 34.

Figure 2G:
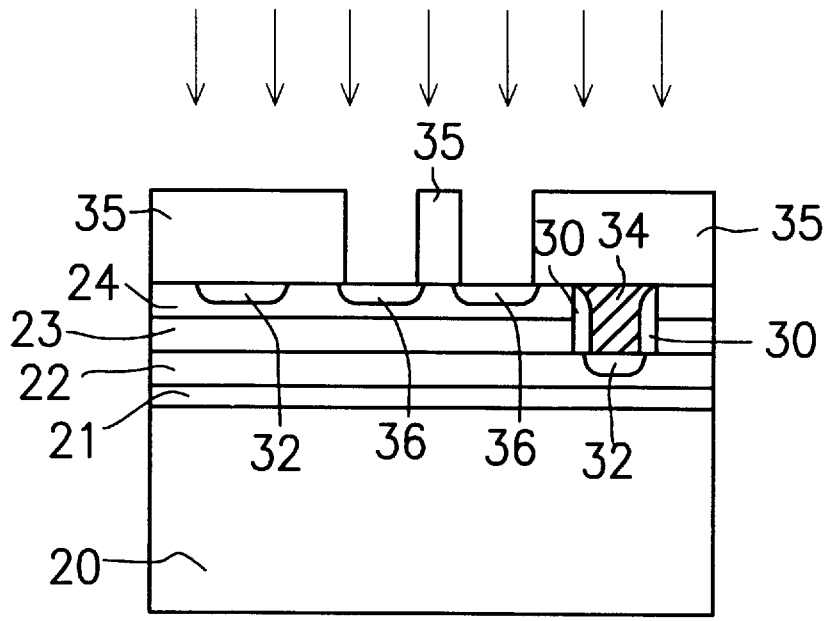

In the subsequent step depicted in FIG. 2G, a photoresist layer 35 is applied by coating the intermediate top surface on the previously formed layers. Then, a photolithographic process is used to define a pattern in the photoresist layer 35 to expose part of the lightly doped first type impurity layer 24. Using the photoresist layer 35 as a mask, second type ions are doped into the lightly doped first type impurity layer 24 to form second type diffusion regions 36. The second type ions are P-type ions or N-type ions. The implantation depth of the second type diffusion regions 36 located inside the lightly doped first type impurity layer 24 is such that no contact is made by the diffusion regions 36 with the lightly doped second type impurity layer 23 below.

Figure 2H:
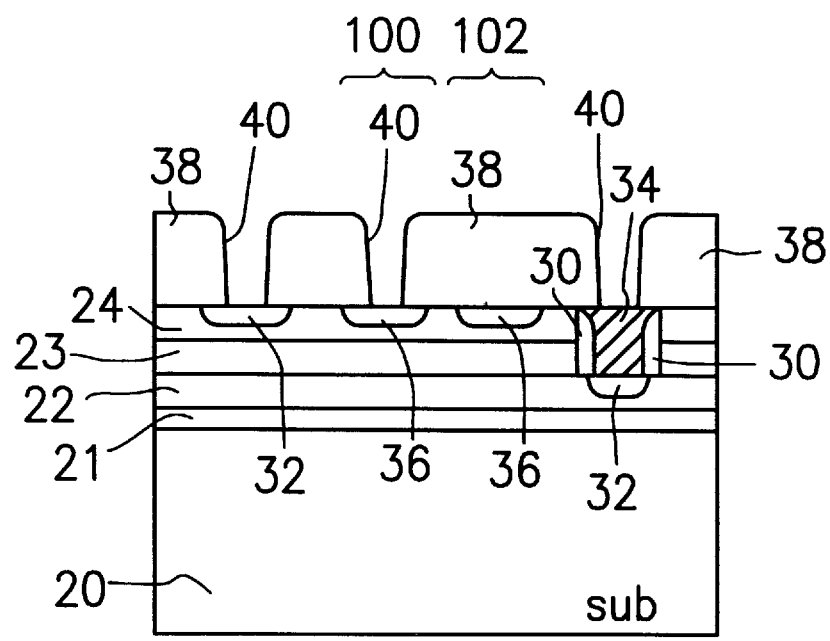

In FIG. 2H, after the photoresist layer 35 is removed, a third insulating layer 38, for example, a silicon dioxide layer or a silicon nitride layer, is formed over the previously formed layers. Subsequently, photolithographic and etching processes are used to form contact windows 40 in the insulating layer 38 that expose conducting layer 34, the first type diffusion regions 32 and some of the second type diffusion regions 36. The ON or OFF state of a memory unit is defined by the formation of a contact window 40. In particular, when a contact window 40 is formed above the second type diffusion region 36, that diffusion region becomes the major component of an ON state memory unit 100. In contrast, when no contact window 40 is formed above the second type diffusion region 36, that diffusion region becomes the major component of an OFF state memory unit 102.

Figure 2I:
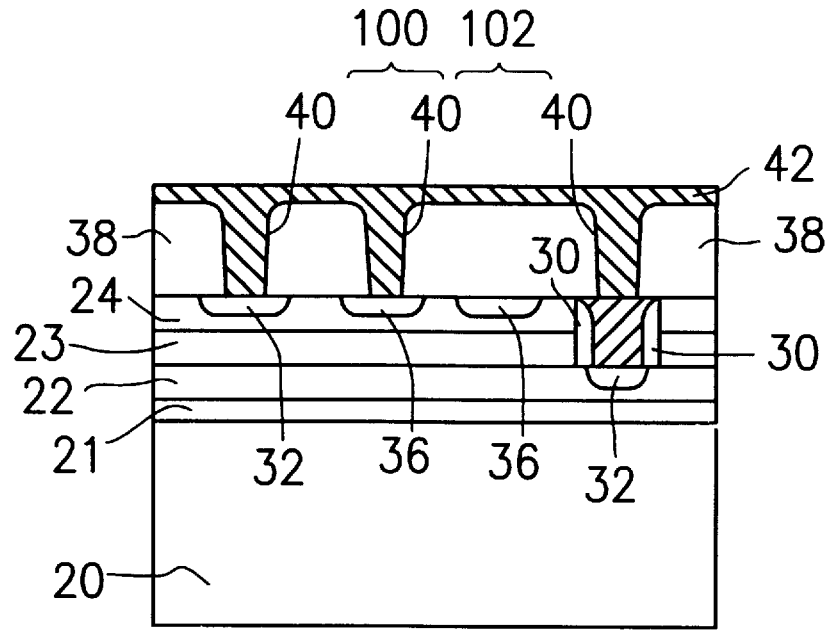
Figure 2J:
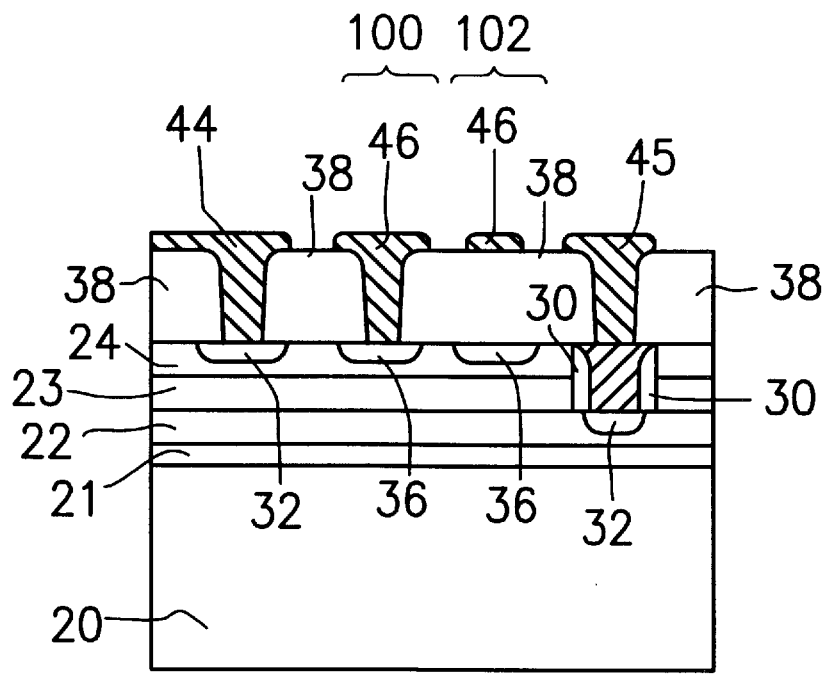

Lastly, as shown in FIGS. 2I and 2J, a second conducting layer 42 is formed above the insulating layer 38 filling the contact windows 40. The conducting layer 42, for example, can be a high concentration impurity polysilicon layer or a metallic layer. Next, photolithographic and etching processes are used to form in the conducting layer 42, triggering word line electrodes 44 above the first type diffusion regions 32, common electrodes 45 above the conducting layer 34 and a plurality of generally parallel and separate strips of bit line electrodes 46. The bit line electrodes 46 intersects the bit lines 25 at an angle, for example, a right angle, and at the intersections, a memory unit is formed having the structure as shown in FIG. 2J. Up to this stage, the front-end processes for the manufacturing of a ROM component having a silicon controlled rectifier structure according to one preferred embodiment of this invention is complete. Subsequent back-end processes are not directly related to this invention, and therefore detailed descriptions are not repeated here.

Figure 3:
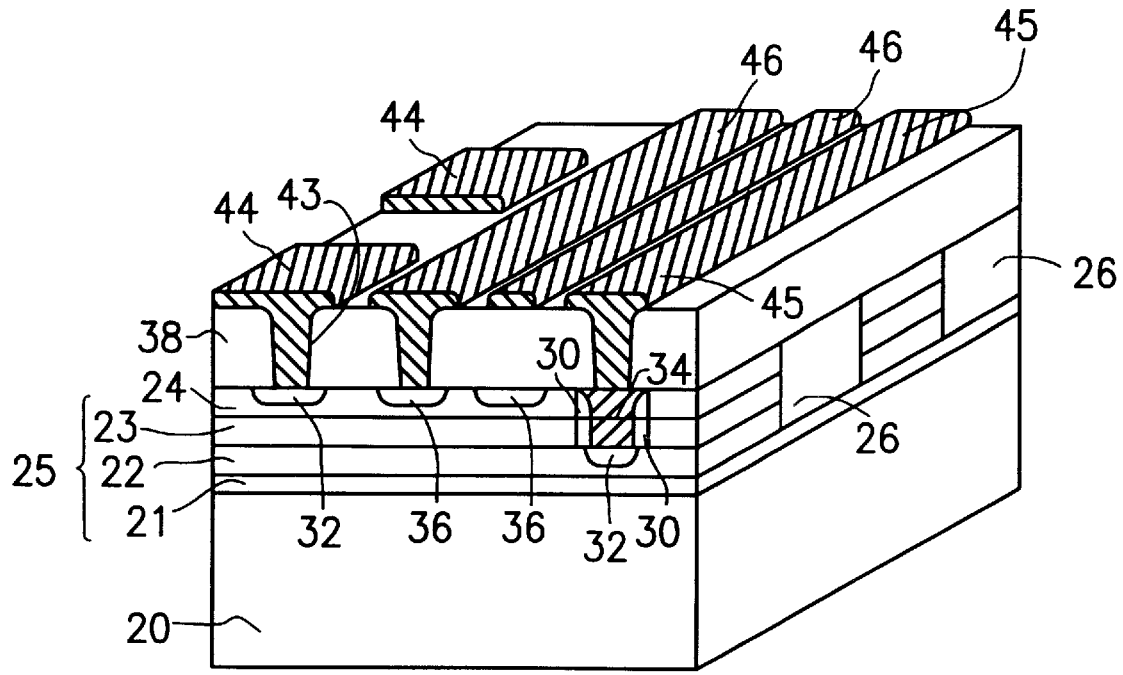
FIG. 3 is a perspective view showing the structure of a ROM component having a silicon controlled rectifier structure according to one preferred embodiment of this invention.
Figure 4:
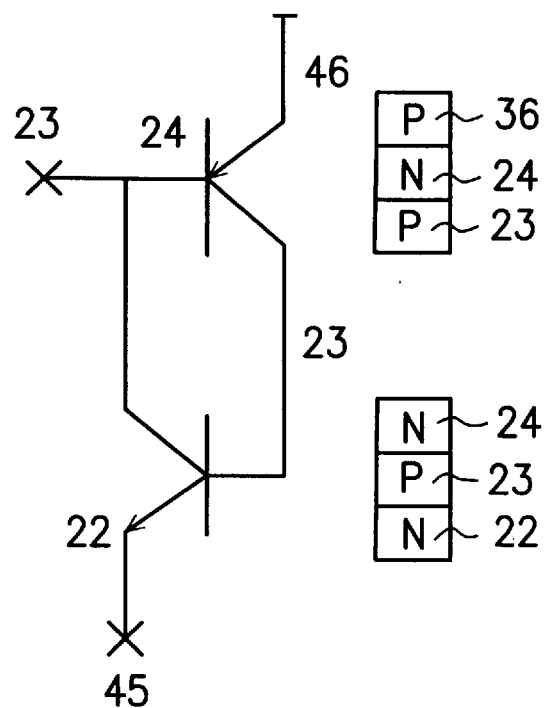
FIG. 4 is a circuit diagram for the memory unit of a ROM component having a silicon controlled rectifier structure according to one preferred embodiment of this invention.

FIG. 3 is a three-dimensional view showing the structure of a ROM component having a silicon controlled rectifier structure while FIG. 4 is a circuit diagram for the memory unit of a ROM component having a silicon controlled rectifier structure according to one preferred embodiment of this invention. ROM component of this invention operates by first applying a suitable voltage to the respective word line electrode 44 and the bit line electrode 46 that leads to a memory unit intended to be read, and when the memory unit is an ON state memory unit 100, current is able to pass from the contact window 40 via the silicon controlled rectifier structure formed by the second diffusion region 36 and the bit line 25 to the common electrode 45 and be detected there. However, when the memory unit is an OFF state memory unit 102, no current will flow to the common electrode 45 via the silicon controlled rectifier structure and, therefore, no current is detected in the common electrode.

Figure 5A:
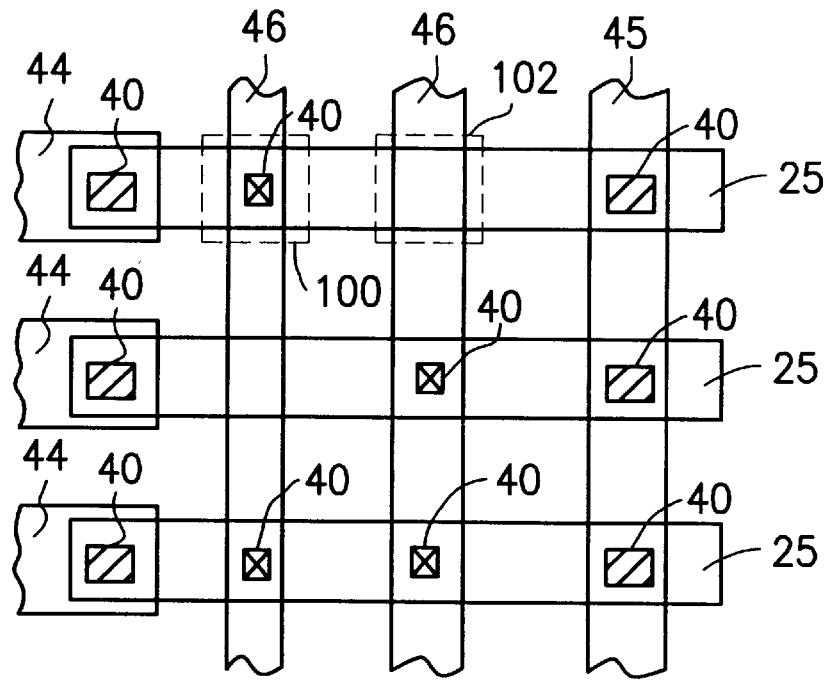
FIG. 5A is a fragmentary top view showing a ROM component having a silicon controlled rectifier structure according to another preferred embodiment of this invention.
Figure 5B:
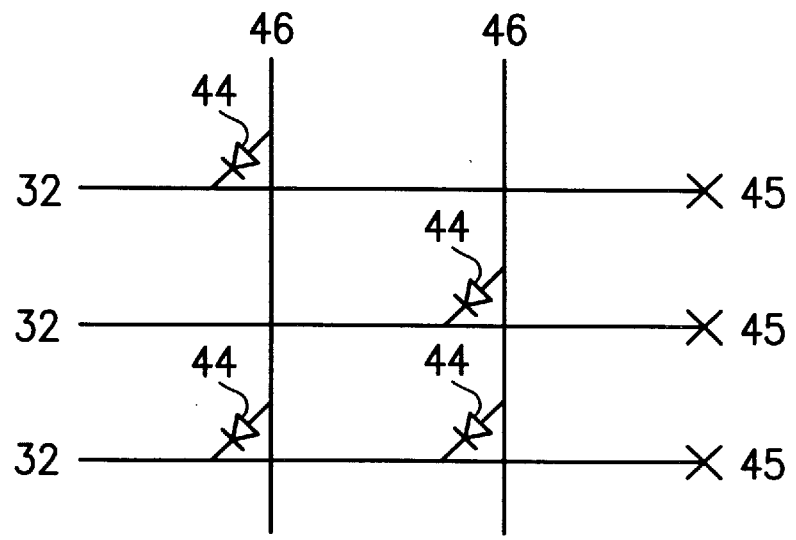
FIG. 5B is an equivalent circuit diagram for part of the ROM component having a silicon controlled rectifier structure according to one preferred embodiment of this invention.

FIG. 5A is fragmentary top view and FIG. 5B is part of the equivalent circuit diagram of a ROM component having a silicon controlled rectifier structure according an embodiment of this invention. At the crossing of a bit line 25 and a bit line electrode 46, a memory unit is formed. For those memory units that contain a contact window 40, ON state memory units 100 are formed, and for those memory units without any contact window 40, OFF state memory units 102 are obtained. The word line electrode 44 and the common electrode 45 are formed one on each side of the bit lines 25 respectively.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for manufacturing a ROM component having a silicon controlled rectifier structure, comprising the steps of:

(a) providing a substrate having a planar surface and forming a first insulating layer over the planar surface;

(b) forming in sequence, a heavily doped first type impurity layer, a lightly doped second type impurity layer and a lightly doped first type impurity layer over a surface of the first insulating layer;

(c) processing the lightly doped first type impurity layer, the lightly doped second type impurity layer and the heavily doped first type impurity layer to form a plurality of generally parallel and separate strips of bit lines lying in a first direction;

(d) forming a second insulating layer on the first insulating layer and on the bit lines;

(e) removing part of the second insulating layer so that a remainder of the second insulating layer is leveled with the lightly doped first type impurity layer;

(f) processing the lightly doped first type impurity layer and the lightly doped second type impurity layer of the bit lines to form a plurality of first contact windows in the bit lines;

(g) forming a plurality of spacers on sidewalls of the first contact windows;

(h) applying a first photoresist layer having a pattern to expose the first contact windows and part of the lightly doped first type impurity layer;

(i) doping first type ions into the heavily doped first type impurity layer at a bottom of the first contact windows and an exposed portion of the lightly doped first type impurity layer, using the first photoresist layer and the spacers as masks, to form a plurality of first type diffusion regions and thereafter removing the first photoresist layer;

(j) filling a first conducting layer into the first contact windows so that a top surface of the first conducting layer is leveled with the lightly doped first type impurity layer;

(k) applying a second photoresist layer on the lightly doped first type impurity layer, the second photoresist layer having a pattern to expose part of the lightly doped first type impurity layer;

(l) doping second type ions into an exposed portion of the lightly doped first type impurity layer, using the second photoresist layer as a mask, to form a plurality of second type diffusion regions, and thereafter removing the second photoresist layer to expose an intermediate top surface;

(m) forming a third insulating layer over the intermediate top surface;

(n) forming a plurality of second contact windows in the third insulating layer to expose the first conducting layer, the first type diffusion regions and part of the second type diffusion regions;

(o) forming a second conducting layer on a surface of the third insulating layer such that the second conducting layer fills the second contact windows; and (p) forming in the second conducting layer a plurality of triggering word line electrodes above the first type diffusion regions, a plurality of common electrodes above the first conducting layer, and a plurality of generally parallel and separate strips of bit line electrodes lying in a second direction, so that the first and second directions cross each other at an angle.

2. The manufacturing method according to claim 1, wherein the first type impurity is an N-type, the second type impurity is a P-type, the first type ions are N-type ions and the second type ions are P-type ions.

3. The manufacturing method of claim 1, wherein the first type impurity is a P-type; the second type impurity is an N-type, the first type ions are P-type ions and the second type ions are N-type ions.

4. The manufacturing method of claim 1, wherein in step (a), the substrate is a silicon substrate.

5. The manufacturing method of claim 1, wherein in step (a), the substrate is an electrically insulating body.

6. The manufacturing method of claim 1, wherein in step (a), the first insulating layer is a silicon nitride layer.

7. The manufacturing method of claim 1, wherein in step (a), the first insulating layer is a silicon dioxide layer.

8. The manufacturing method of claim 1, wherein in step (b), the heavily doped first type impurity layer has a concentration level of about $10^{20}/cm^3$.

9. The manufacturing method of claim 1, wherein in step (b), the lightly doped second type impurity layer has a concentration level of about $10^{17}/cm^3$.

10. The manufacturing method of claim 1, wherein in step (b), the lightly doped first type impurity layer has a concentration level of about $10^{16}/cm^3$.

11. The manufacturing method of claim 1, wherein in step (d), the second insulating layer is a silicon dioxide layer.

12. The manufacturing method of claim 1, wherein in step (e), the second insulating layer is removed using an anisotropic etching back method.

13. The manufacturing method of claim 1, wherein in step (e), the second insulating layer is removed using a chemical-mechanical polishing method.

14. The manufacturing method of claim 1, wherein in step (g), the spacers are formed by first forming a silicon dioxide layer over the lightly doped first type impurity layer and a first contact window surface, followed by an anisotropic etching process to remove part of the silicon dioxide layer forming the spacers.

15. The manufacturing method of claim 1, wherein in step (g), the spacers are formed by first forming a silicon nitride layer over the lightly doped first type impurity layer and a first contact window surface, followed by an anisotropic etching process to remove part of the silicon nitride layer forming the spacers.

16. The manufacturing method of claim 1, wherein in step (i), the depths of the first type diffusion regions in the lightly doped first type impurity layer are such that no contact is made with the lightly doped second type impurity layer below.

17. The manufacturing method of claim 1, wherein in step (j), the first conducting layer is formed by first forming a doped polysilicon layer above and filling the first contact windows, followed by an anisotropic etching back process to remove part of the doped polysilicon layer with the lightly doped first type impurity layer as an etching end point.

18. The manufacturing method of claim 1, wherein in step (j), the first conducting layer is formed by first forming a doped polysilicon layer above and filling the first contact windows, followed by a chemical-mechanical polishing method to remove part of the doped polysilicon layer with the lightly doped first type impurity layer as a removal end point.

19. The manufacturing method of claim 1, wherein in step (j), the first conducting layer is formed by first forming a metallic tungsten layer above and filling the first contact windows, followed by an anisotropic etching back process to remove part of the metallic tungsten layer with the lightly doped first type impurity layer as an etching end point.

20. The manufacturing method of claim 1, wherein in step (j), the first conducting layer is formed by first forming a metallic tungsten layer above and filling the first contact windows, followed by a chemical-mechanical polishing method to remove part of the metallic tungsten layer with the lightly doped first type impurity layer as a removal end point.

21. The manufacturing method of claim 1, wherein in step (l), a depth of the second diffusion regions in the first type impurity layer is such that no contact is made with the lightly doped second type impurity layer below.

22. The manufacturing method of claim 1, wherein in step (m), the third insulating layer is a silicon dioxide layer.

23. The manufacturing method of claim 1, wherein in step (m), the third insulating layer is a silicon nitride layer.

24. The manufacturing method of claim 1, wherein in step (o), the second conducting layer is a doped polysilicon layer.

25. The manufacturing method of claim 1, wherein in step (o), the second conducting layer is a metallic layer.

26. The manufacturing method of claim 1, wherein in step (p), the first direction and the second direction cross each other perpendicularly.

27. The manufacturing method of claim 1, wherein in step (b), the layers formed in sequence are formed by epitaxial growth.

28. The manufacturing method of claim 1, wherein in step (c), the processing of the layers is by photolithography and etching.

29. The manufacturing method of claim 1, wherein in step (f), the lightly doped first type impurity layer and the lightly doped second type impurity layer are processed by photolithography and etching.

30. The manufacturing method of claim 1, wherein in step (n), the a plurality of second contact windows in the third insulating layer are formed by photolithography and etching.

31. The manufacturing method of claim 1, wherein in step (p), in the second conducting layer, the plurality of triggering word line electrodes, the plurality of common electrodes, and the plurality of generally parallel and separate strips of bit line electrodes are formed by photolithography and etching.

* * * * *